US007777229B2

(12) United States Patent
Swain et al.

(10) Patent No.: US 7,777,229 B2
(45) Date of Patent: Aug. 17, 2010

(54) METHOD AND APPARATUS FOR REDUCING SMEAR IN BACK-ILLUMINATED IMAGING SENSORS

(75) Inventors: Pradyumna Kumar Swain, Princeton, NJ (US); Mahalingam Bhaskaran, Princeton, NJ (US); Peter Levine, Princeton, NJ (US); Norman Goldsmith, Princeton, NJ (US)

(73) Assignee: Sarnoff Corporation, Princeton, NJ (US)

( * ) Notice: Subject to any disclaimer, the term of this patent is extended or adjusted under 35 U.S.C. 154(b) by 518 days.

(21) Appl. No.: 11/844,775

(22) Filed: Aug. 24, 2007

(65) Prior Publication Data

US 2008/0061390 A1 Mar. 13, 2008

Related U.S. Application Data

(60) Provisional application No. 60/843,624, filed on Sep. 11, 2006, provisional application No. 60/829,947, filed on Oct. 18, 2006.

(51) Int. Cl.
*H01L 27/14* (2006.01)
(52) U.S. Cl. .......... 257/72; 257/E27.139; 257/E27.145; 257/E27.161; 257/E27.162; 438/60; 438/75; 438/144
(58) Field of Classification Search .................. 257/72, 257/E27.13–E27.163; 438/60, 75, 144
See application file for complete search history.

(56) References Cited

U.S. PATENT DOCUMENTS 5,917,216 A 6/1999 Floyd et al.

(Continued)

OTHER PUBLICATIONS

Liu, S. et al, "Structures by Selective Epitaxial Lateral Overgrowth," SOS/SOI Technology Workshop, Proceedings, p. 16 (1988).

(Continued)

*Primary Examiner*—Charles D Garber
*Assistant Examiner*—Yasser A Abdelaziez
(74) *Attorney, Agent, or Firm*—Lowenstein Sandler PC

(57) ABSTRACT

A method for fabricating a back-illuminated semiconductor imaging device and resulting imaging device is disclosed, which includes the steps providing a substrate having a front surface and a back surface; growing an epitaxial layer substantially overlying the front surface of the substrate; forming at least one barrier layer substantially within the epitaxial layer; fabricating at least one imaging structure overlying and extending into the epitaxial layer, the imaging structure at least one charge transfer region, the at least one barrier layer substantially underlying the at least one charge transfer region, wherein light incident on the back surface of the substrate generates charge carriers which are diverted away from the at least one charge transfer region by the at least one barrier layer. At least a portion of the epitaxial layer is grown using an epitaxial lateral overgrowth technique. The barrier layer can be a high energy implant formed substantially within the epitaxial layer, an optical shield made of an optically opaque material surrounded by oxide on all sides, or a combination of both. The imaging structure can be a CCD or CMOS imaging structure.

24 Claims, 9 Drawing Sheets

U.S. PATENT DOCUMENTS 5,923,370 A 7/1999 Miethig et al.
2004/0007722 A1 1/2004 Narui et al.
2006/0186560 A1 8/2006 Swain et al.

OTHER PUBLICATIONS

Pak, J.J et al, "A New Method of Forming a Thin Single-Crystal Silicon Diaphragm Using Merged Epitaxial Lateral Overgrowth for Sensor Applications," Electron Device Letters, vol. 12, Issue 11, pp. 614-616 (1991).

Shahidi, G. et al, "Fabrication of CMOS on Ultrathin SOI Obtained by Epitaxial Lateral Overgrowth and Chemical-Mechanical Polishing," Electron Devices Meeting, Technical Digest, pp. 587-590 (1990).

Dolny, G., et al, "Fabrication of SOI CMOS Over Large-Area Continuous-Oxide Films Formed Using Epitaxial Lateral Overgrowth Techniques," Electronic Devices, vol. 35, Issue 12, p. 2437(1988).

METHOD AND APPARATUS FOR REDUCING SMEAR IN BACK-ILLUMINATED IMAGING SENSORS

CROSS-REFERENCE TO RELATED APPLICATIONS

This application claims the benefit of U.S. provisional patent application No. 60/843,624 filed Sep. 11, 2006, and U.S. provisional patent application No. 60/829,947 filed Oct. 18, 2006, the disclosures of which are incorporated herein by reference in their entirety.

FIELD OF THE INVENTION

The field of the present invention is semiconductor device fabrication and device structure. More specifically, the present invention relates to a method for reducing smear in back illuminated imaging sensors.

BACKGROUND OF THE INVENTION

CMOS or CCD image sensors are of interest in a wide variety of sensing and imaging applications in a wide range of fields including consumer, commercial, industrial, and space electronics. Imagers based on charge coupled devices (CCDs) are currently the most widely utilized. CCDs are employed either in front or back illuminated configurations. Front illuminated CCD imagers are more cost effective to manufacture than back illuminated CCD imagers such that front illuminated devices dominate the consumer imaging market. Front-illuminated imagers, however, have significant performance limitations such as low fill factor/low sensitivity. The problem of low fill factor/low sensitivity is typically due to shadowing caused by the presence of opaque metal bus lines, and absorption by an array circuitry structure formed on the front surface in the pixel region of a front-illuminated imager. Thus, the active region of a pixel is typically relatively small (low fill factor) in large format (high-resolution) front-illuminated imagers.

An effect called smear can occur when light incident on the front-side of a front-illuminated imager falls on its charge transfer region regions, resulting in unwanted generation of charge carriers that produce a noise signal in a resulting image. Referring now to FIG. 1, a technique for reducing or eliminating smear in a typical front-illuminated imager is depicted. The front-illuminated imager 2 includes a silicon substrate 4, with overlying and alternating light detection regions 6 and charge transfer regions 8, separated by pixel isolation implants 10. A CCD gate contact 12 overlies each of the charge transfer regions 8. To reduce smear, the charge transfer regions are protected from incident light by placing metal shields 14 over the CCD gate contacts 12 and the charge transfer regions 8. Light falling on the CCD regions can also be made to converge on the detection regions 6 by employing micro lens (not shown).

Back-illuminated semiconductor imaging devices are advantageous over front-illuminated imagers for high fill factor, better overall efficiency of charge carrier generation and collection, and are suitable for small pixel arrays. One goal of the performance of back illuminated, semiconductor imaging devices is that charge carriers generated by light incident on the back side should be driven to the front side quickly to avoid any horizontal drift, which may smear the image.

Accordingly, what would be desirable, but has not yet been provided, is a device and method for fabricating back illuminated imagers which incorporate some form of light shielding is needed to avoid smear. In the case of back-illuminated imagers, any such shielding should be underneath the charge transfer regions and also should be well aligned to them.

SUMMARY OF THE INVENTION

Disclosed is a method and resulting device for fabricating a back-illuminated semiconductor imaging device, comprising the steps of providing a substrate having a front surface and a back surface; growing an epitaxial layer substantially overlying the front surface of the substrate; forming at least one barrier layer substantially within the epitaxial layer; fabricating at least one imaging structure overlying and extending into the epitaxial layer, the imaging structure comprising at least one charge transfer region, the at least one barrier layer substantially underlying the at least one charge transfer region, wherein light incident on the back surface of the substrate generates charge carriers which are diverted away from the at least one charge transfer region by the at least one barrier layer. At least a portion of the epitaxial layer is grown using an epitaxial lateral overgrowth technique.

The resulting back-illuminated semiconductor imaging device, comprises a substrate having a front surface and a back surface; an epitaxial layer substantially overlying the front surface of the substrate; at least one barrier layer substantially formed within the epitaxial layer; at least one imaging structure formed at least partially overlying and extending into said epitaxial layer, the imaging structure comprising at least one charge transfer region, the at least one barrier layer substantially underlying the at least one charge transfer region; wherein light incident on the back surface of the substrate generates charge carriers which are diverted away from the at least one charge transfer region by the at least one barrier layer.

The barrier layer can be a high energy implant formed substantially within the epitaxial layer, an optical shield made of an optically opaque material surrounded by oxide on all sides, or a combination of both. When both a high energy implant and an optical shield are employed, the optical shield can overly the high energy implant and vice versa. In either case, the high energy implant and the optical shield are substantially aligned with the overlying charge transfer region of the imaging structure. The imaging structure can be, for example, a CCD or CMOS imaging structure.

SUMMARY DESCRIPTION OF THE DRAWINGS

Figure 22:
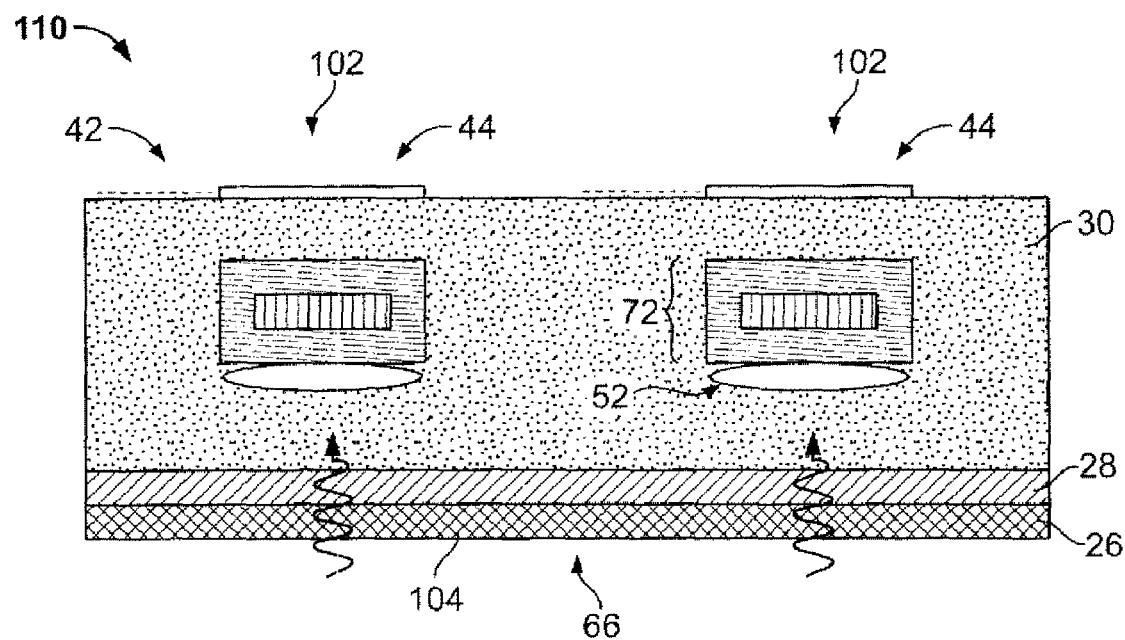
Figure 23:
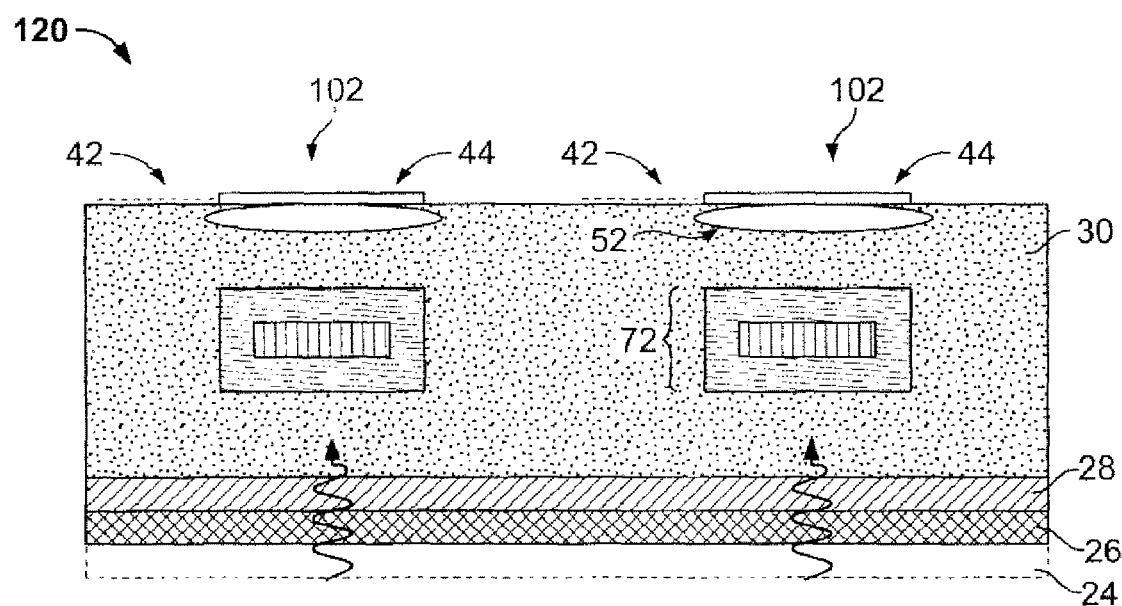

FIG. 22 shows the step of thinning the handle wafer by etching from the back side surface to produce the final back-illuminated imager, constructed in accordance with the third embodiment of the present invention; and FIG. 23 illustrates a fourth embodiment of a process for manufacturing smear-free back-illuminated imagers and a resulting device similar to the device of FIG. 22, except that high energy implants are inserted between optical shields and charge transfer regions.

DETAILED DESCRIPTION OF THE INVENTION

The following embodiments are intended as exemplary, and not limiting. In keeping with common practice, figures are not necessarily drawn to scale.

Figure 1:
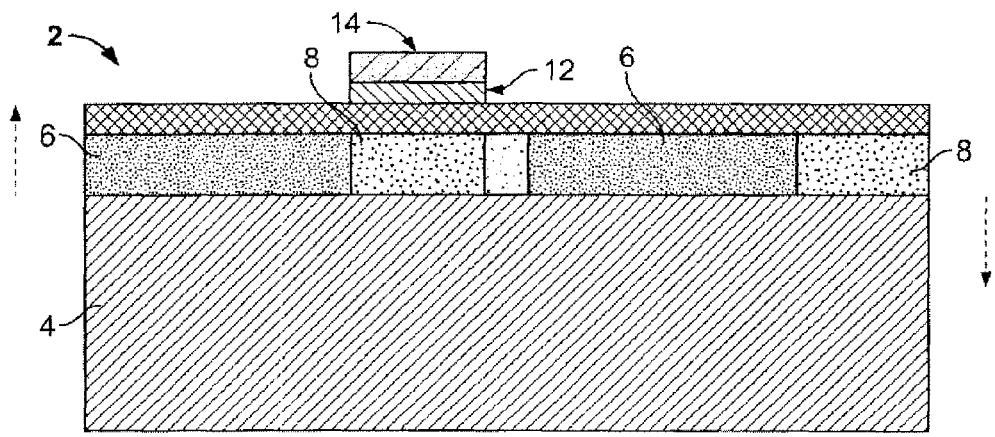
FIG. 1 shows a technique for reducing or eliminating smear in a typical front-illuminated imager of the prior art by means of placing metal shields over charge transfer regions.
Figure 2:
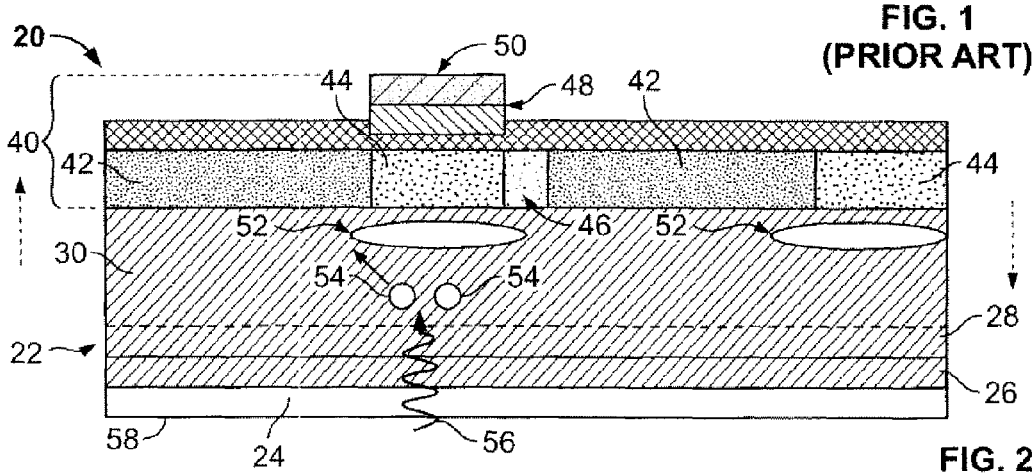
FIG. 2 depicts a back-illuminated imager employing high energy implants, constructed in accordance with a first embodiment of the present invention.

FIG. 2 depicts a back-illuminated imager employing high energy implants, constructed in accordance with a first embodiment of the present invention, generally indicated at 20. An initial substrate 22, sometimes referred to in the art as a semiconductor-on-insulator (SOI) substrate, is composed of handle wafer 24 to provide mechanical support during processing, an insulator layer 26 (which can be, for example, a buried oxide layer of silicon), and seed layer 28. The handle wafer 24 may be a standard silicon wafer used in fabricating integrated circuits. Alternatively, the handle wafer 24 may be any sufficiently rigid substrate composed of a material which is compatible with the steps of the method disclosed herein. Insulator layer 26 may comprise an oxide of silicon with a thickness of about 1 micrometer. Among other embodiments, the thickness of insulator layer 26 may fall in a range from about 10 μm to about 5000 nm. Seed layer 28 may be comprised of crystalline silicon having a thickness from about 5 nanometers to about 100 nanometers.

SOI substrates are available commercially and are manufactured by various known methods. In one method, thermal silicon oxide is grown on silicon wafers. Two such wafers are joined with oxidized faces in contact and raised to a high temperature. In some variations, an electric potential difference is applied across the two wafers and the oxides. The effect of these treatments is to cause the oxide layers on the two wafers to flow into each other, forming a monolithic bond between the wafers. Once the bonding is complete, the silicon on one side is lapped and polished to the desired thickness of seed layer 28, while the silicon on the opposite side of the oxide forms handle wafer 24. The oxide forms insulator layer 26.

Another method of fabricating a SOI substrates begins with obtaining a more standard semiconductor-on-insulator (SOI) wafer in which the seed layer 28 has a thickness in the range from about 100 nm to about 1000 nm. A thermal oxide is grown on the semiconductor substrate, using known methods. As the oxide layer grows, semiconductor material of the semiconductor substrate is consumed. Then the oxide layer is selectively etched off, leaving a thinned semiconductor substrate having a desired seed layer thickness.

SOI substrates manufactured by an alternative method, known as Smart Cut™, are sold by Soitec, S.A.

Seed layer 28 may comprise silicon (Si), Germanium (Ge), SiGe alloy, a III-V semiconductor, a II-VI semiconductor, or any other semiconductor material suitable for the fabrication of optoelectronic devices.

A portion of an epitaxial layer 30 is formed on the seed layer 28, using seed layer 28 as the template. Depending on the material of seed layer 28, epitaxial layer 30 may comprise silicon (Si), Germanium (Ge), SiGe alloy, a III-V semiconductor, a II-VI semiconductor, or any other semiconductor material suitable for the fabrication of optoelectronic devices. Epitaxial layer 30 may have a thickness from about 1 micrometers to about 50 micrometers. The resistivity of the epitaxial layer 30 can be controlled by controlling the epitaxial growth process.

Figure 3:
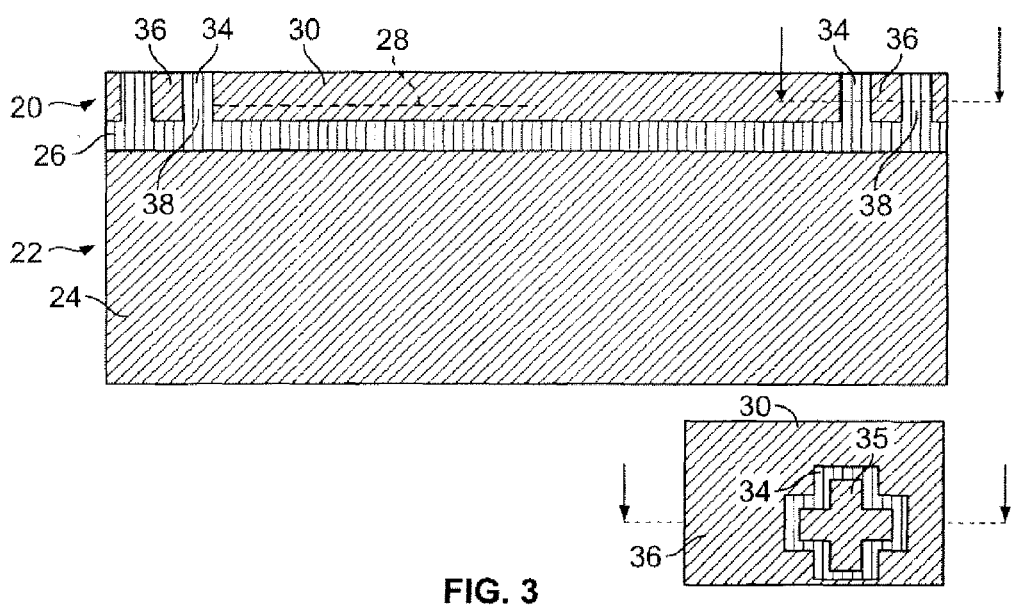
FIG. 3 shows the step of forming alignment keys in the epitaxial layer, according to the first embodiment of the present invention.

Referring now to FIG. 3, once epitaxial layer 30 is grown, alignment keys 34 are printed on and etched into the epitaxial layer 30. The alignment keys 34 can be used to align subsequent layers during the imager fabrication process. The use of alignment keys can result in highly accurate alignment of about 0.1 micrometer or less for subsequently deposited layers. Using photolithography, key patterns 35 are printed on a top portion 36 of the epitaxial layer 30. A trench etch process can be used to etch the underlying epitaxial layer 30 below the key patterns 34 until the etched away silicon is stopped by the underlying insulator/buried oxide layer 26 using plasma etching. The open trenches 38 are then filled with a electrically insulating material such as an oxide of silicon, silicon carbide, silicon nitride, or poly-silicon.

Referring again to FIG. 2, one or more imaging structures 40, such as but not limited to CCD or CMOS imaging structures, may be fabricated on the epitaxial layer 30. The one or more imaging structures 40 may include alternating light detection regions 42 and charge transfer regions 44, separated by pixel isolation implants (dicing streets) 46, and gate contacts 48 substantially overlying the charge transfer regions 44. To reduce smear, the charge transfer regions are protected from incident light by placing metal shields 50 over the gate contacts 48. More importantly, a high energy ion implantation can be performed, i.e. high energy implants 52 can be formed within the epitaxial layer 30. For a p-type substrate, high energy implants 52 can be formed by ion implanting p-type impurities into an p-type epitaxial layer (and likewise n-type impurities for an n-type epitaxial layer). The relationship between the high energy implants to protecting overlying optical devices from unwanted charge carriers will be discussed hereinbelow.

The high energy implants 52 can act as a potential barrier to charge carriers 54 generated by light 56 incident on the back side surface 58 of the back-illuminated imager 30 that may otherwise migrate toward the charge transfer regions 44. Instead, the high energy implants 52 cause the charge carriers 56 to move toward the adjacent light detection regions 42. This prevents the creation of unwanted smear signals.

CMOS imager arrays using high energy implants 52 to prevent smear may be employed in an active pixel sensor (APS) architecture. APS imagers have a buffer amplifier and other circuits within a pixel. The embedded high energy implants 52 may used to prevent light from reaching peripheral circuits on the CMOS imager which may fall outside of the imaging area but may be illuminated by back illumination. If light is allowed to fall on these CMOS circuit components, undesirable effects such as loss of signal charge, streaking in the image, and excess noise may result.

The high energy implant concept is of particular value when used in combination with back illuminated interline transfer (IT) CCD imagers. In an IT-CCD architecture, vertical and horizontal CCD transfer registers need to be shielded from unwanted light, otherwise a smear signal is produced which can be seen in an output image. Also, these registers can produce a smear signal if photoelectrons enter the CCD register. High energy implant techniques, combined with Epitaxial Lateral Overgrowth techniques (ELO), to be discussed hereinbelow, can reduce or eliminate smear in back-illuminated IT-CCD devices.

Figure 10:
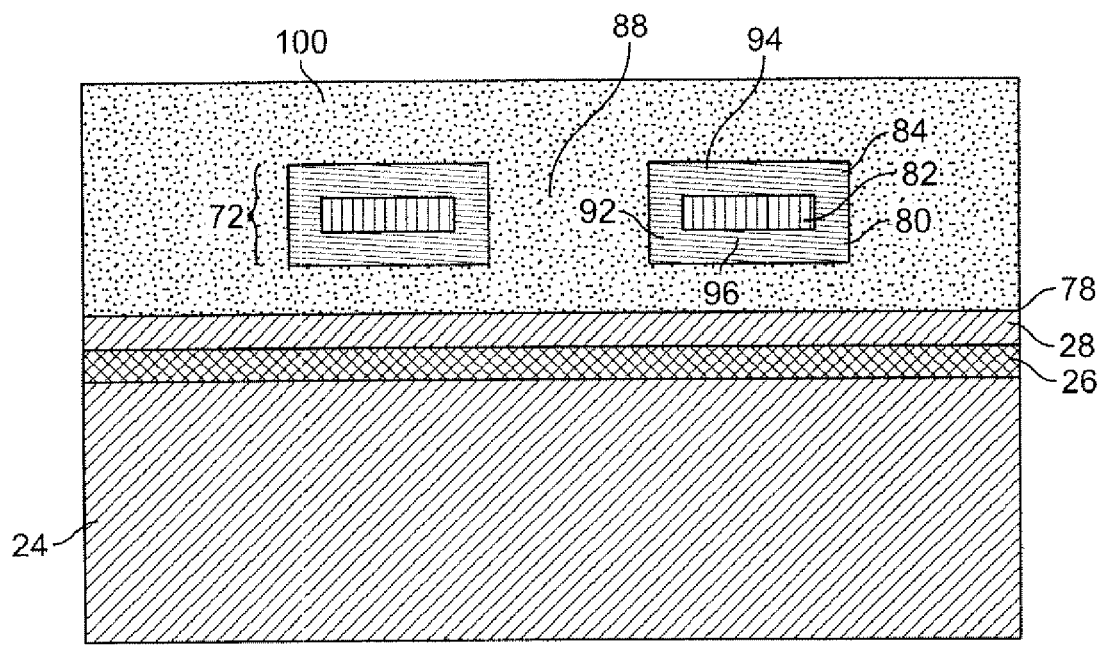
FIG. 10 shows the step of using an Epitaxial Lateral Overgrowth (ELO) or a Merged ELO technique to grow a remaining portion of the partial epitaxial layer.
Figure 11:
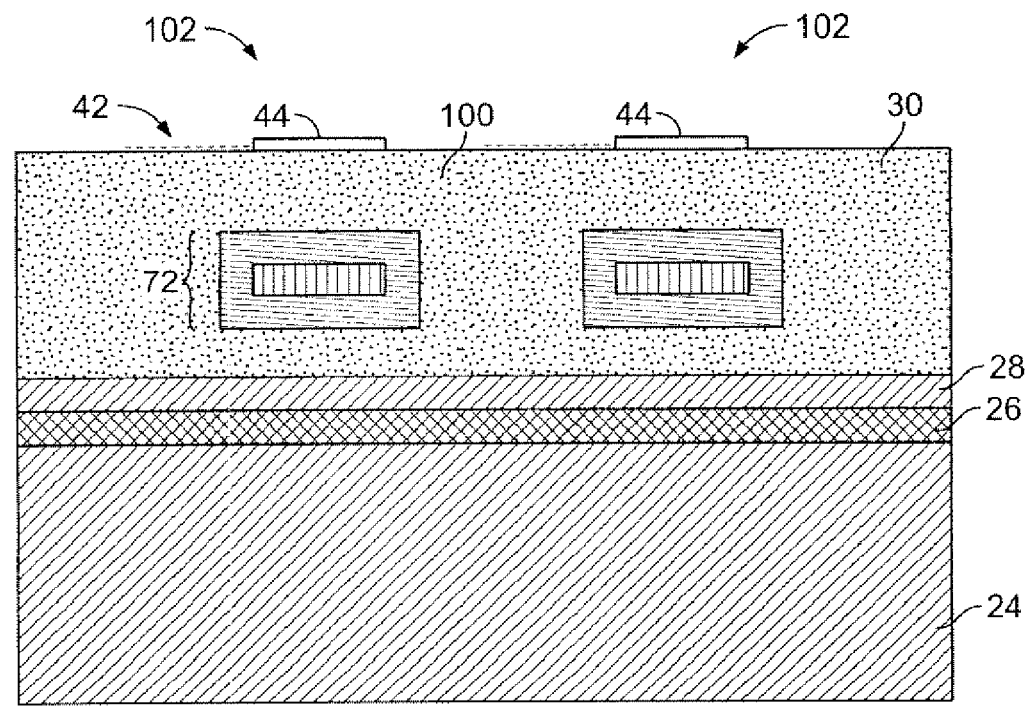
FIG. 11 shows the step of fabricating one or more imaging structures on the epitaxial layer.
Figure 12:
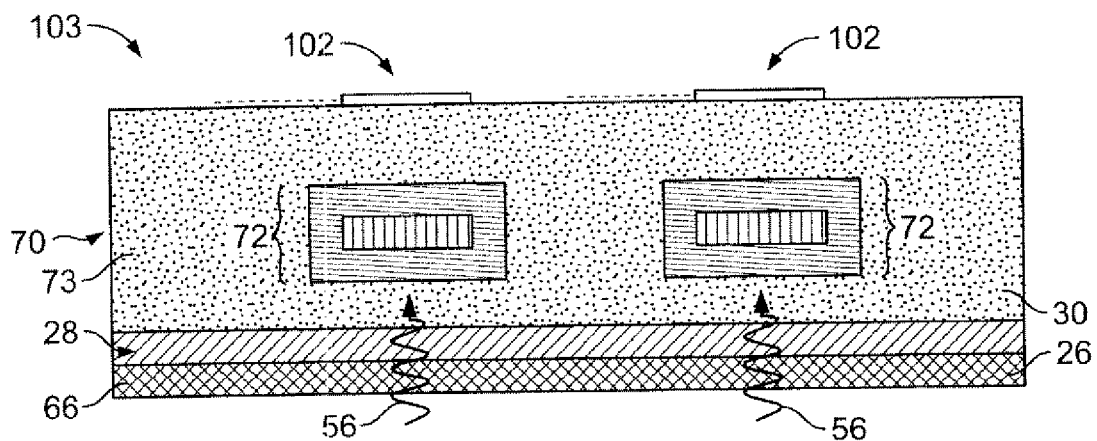
FIG. 12 shows the step of thinning the handle wafer by etching from the back side surface to produce the final of the back-illuminated imager, constructed in accordance with the second embodiment of the present invention.

FIG. 4-12 illustrate a process for manufacturing smear-free back-illuminated imagers and a resulting device according to a second embodiment of the present invention, generally indicated at 70, wherein like reference numbers indicate like structures to those described in the first embodiment 30 of FIG. 2. Referring now to FIG. 12, which depicts the fully manufactured back-illuminated imager 70, optical shields 72 are deposited and patterned on a partially grown silicon epitaxial layer 30 using an ELO technique. The optical shields 72 are aligned with charge transfer regions 44 during device fabrication.

The optical shields 72 can be made from any suitable opaque material such that light does not penetrate the optical shields 72. In some embodiments, the optical shields 72 can be made from an optically absorptive material. In other embodiments of the present invention, the optical shields 72 can be made from any suitable reflective material. Suitable opaque materials include high melting point refractory metals such as tungsten and its silicides, silicon nitride, silicon carbide, and metallic oxides such as hafnium oxide or zirconium oxides. When an absorptive material is used, incident light 56 is scattered within the optical shield 72 or otherwise does not penetrate to the charge transfer regions 44, where it can generate unwanted charge carriers. When a reflective material is used, light reflected from the optical shields 72 is reflected back toward the back side surface 66 of the back-illuminated imager 70, where it may pass a second time through a rear portion 73 of the epitaxial layer 30. This is useful for longer wavelengths of the incident light 56, where the absorption length is greater than the spacing from the optical shields 72 to the back side surface 66. This causes more light 56 to be absorbed that generates more electron-hole pairs that are collected in the light detection regions 42, thereby increasing quantum efficiency.

A doped graded layer 74 formed within the light input side 76 of the optical shields 72 can reduce recombination of signal charge at the optical shields 72. The graded doping profile is designed to repel the charge carriers 54 away from the back surface 66. Wavelengths of light with absorption lengths less then the distance from the illuminated back side surface 66 to the optical shields 72 can photo-generate hole-electron pairs with relatively little light reaching the optical shields 72. As a result, a nearly 100 percent optical fill factor is maintained. It should be noted that the same optical shields 72 may be used for imagers that use hole detection rather than electron detection.

Figure 4:
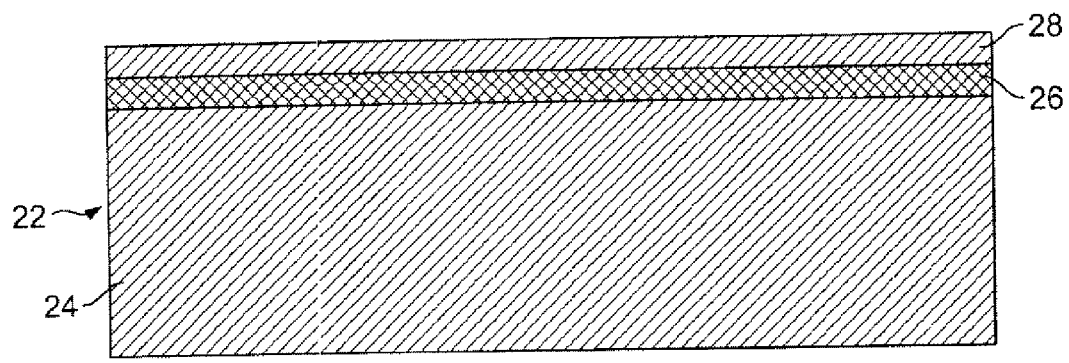
FIG. 4 shows a silicon-on-insulator (SOI) substrate used as the starting material for the manufacture of a back-illuminated imager employing optical shields to reduce smear, constructed in accordance with a second embodiment of the present invention.
Figure 5:
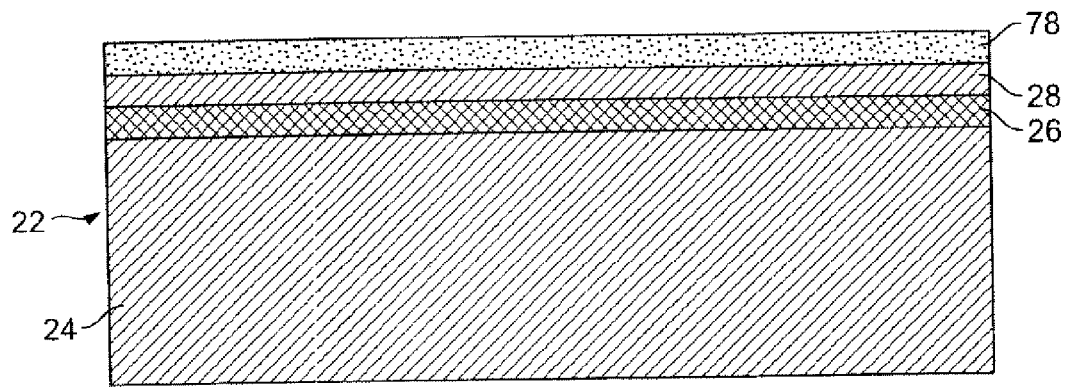
FIG. 5 shows the step of depositing a partial epitaxial layer substantially overlying a seed layer of the substrate depicted in FIG. 4.
Figure 6:
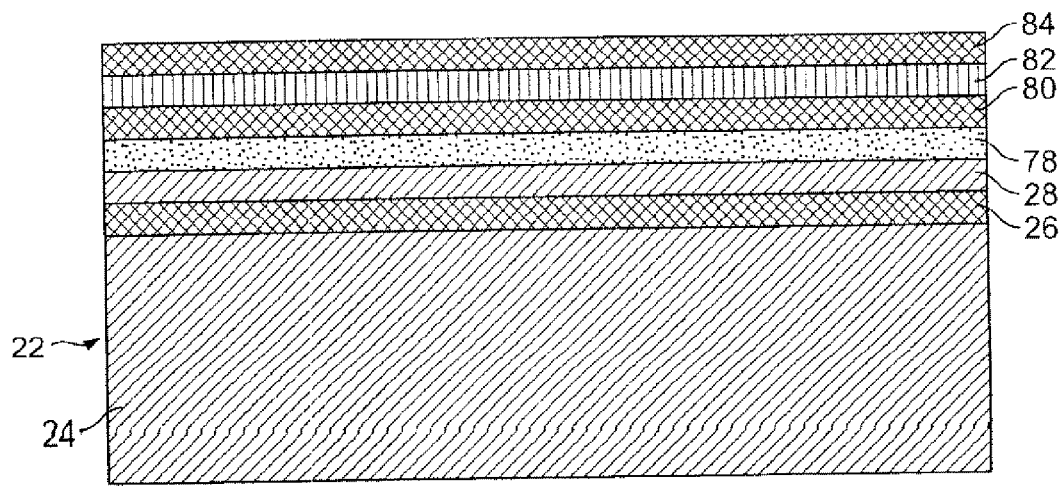
FIG. 6 shows the step of depositing a thin oxide layer substantially overlying the partial epitaxial layer of FIG. 5.
Figure 7:
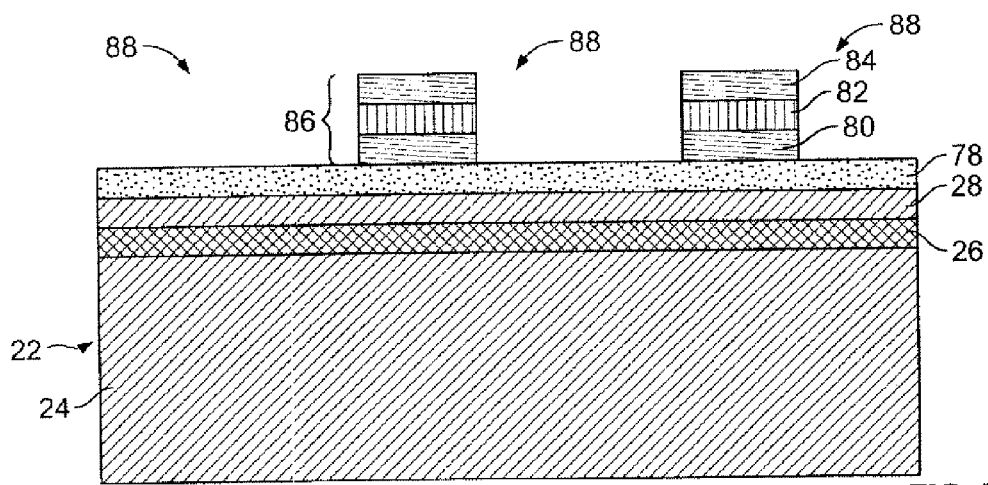
FIG. 7 shows the step of patterning layers of oxide and an optically opaque layer using photolithography followed by anisotropic etching so as to produce sandwich structures with open gaps therebetween.
Figure 8:
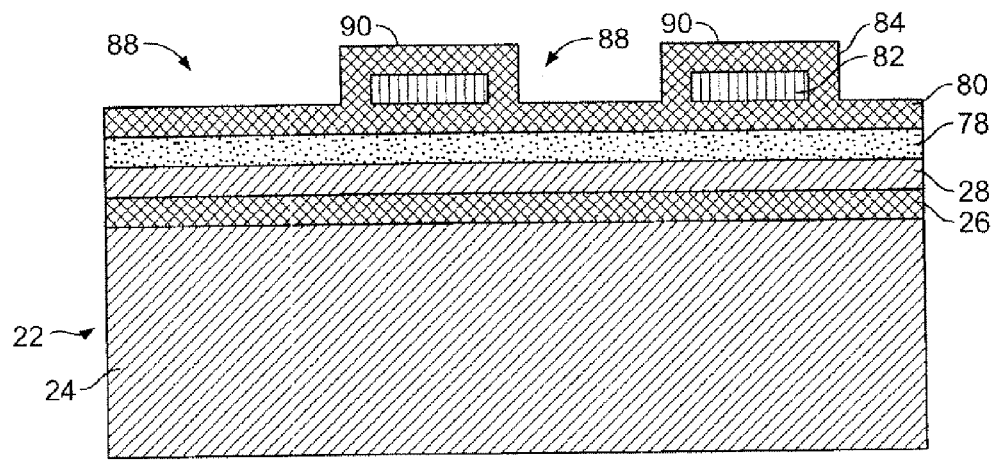
FIG. 8 shows the step of filling the open gaps with another layer of oxide.
Figure 9:
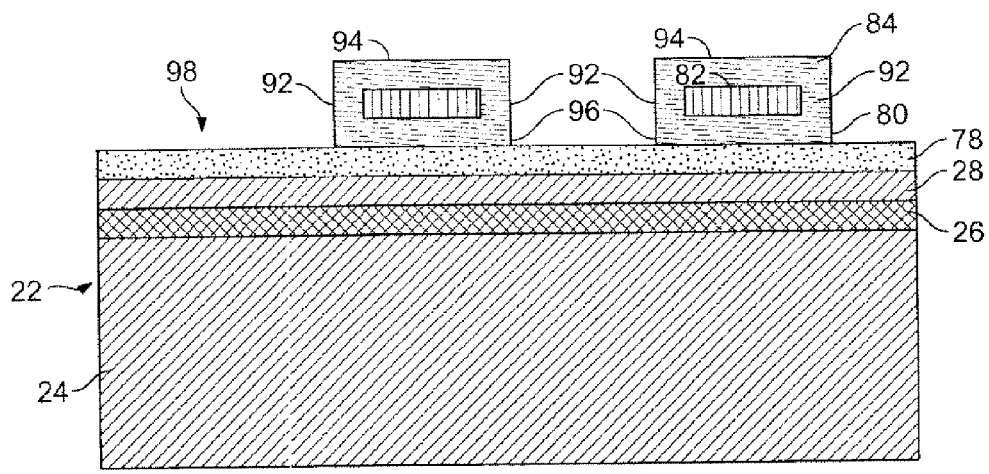
FIG. 9 shows a second step of patterning involving photolithography and anisotropic etching to produce an optically opaque layer encapsulated by oxide on the sides, top and bottom, with the remaining surfaces of the partial epitaxial layer exposed.

Referring now to FIG. 4, an SOI substrate 22 is used as the starting material. As with the embodiment of FIG. 2, the SOI substrate 22 is composed of handle wafer 24, an insulator layer 26, and seed layer 28. Referring now to FIG. 5, a partial epitaxial layer 78 of about 5 um in thickness with a desired resistivity is grown substantially overlying the seed layer 28. Referring now to FIG. 6, a thin oxide layer 80, preferably an oxide of silicon, is deposited substantially overlying the partial epitaxial layer 78. A suitable optically opaque layer 82 (absorptive or reflective) of appropriate thickness is deposited substantially overlying the thin oxide layer 80. An additional layer of oxide 84 is deposited substantially overlying the optically opaque layer 82. Referring now to FIG. 7, the layers of oxide 80, 84 and optically opaque layer 82 are patterned with photolithography followed by anisotropic etching so as to produce sandwich structures 86 with open gaps 88 therebetween. Alignment keys (not shown) are also printed on and etched into the exposed partial epitaxial layer 78 in a manner similar to that described in FIG. 3 for subsequent optical component alignment. Referring now to FIG. 8, another layer of oxide 90 is deposited in the open gaps 88, followed by photo and anisotropic etching to produce the device configuration of FIG. 9, in which the optically opaque layer 82 is encapsulated by oxide on the sides 92, top 94, and bottom 96, with the remaining surfaces 98 of the partial epitaxial layer 78 exposed.

Referring now to FIG. 10, using an Epitaxial Lateral Overgrowth (ELO) or Merged ELO technique, a remaining portion 100 of the exposed partial epitaxial layer 78 is grown for about 5 um to fill in the open gaps 88 and to cover the top oxide portions 94 encapsulating the optically opaque layers 82 to form the optical shields 72. Suitable ELO and MELO techniques for growing the remaining portion 100 of the exposed partial epitaxial layer 78 can be found in Liu, S.; Fechner, P.; Friedrick, J.; Neudeck, G.; Velo, L.; Bousse, L.; Plummer, J., "Structures by selective epitaxial lateral overgrowth," SOS/SOI Technology Workshop, 1988, Proceedings, 1988 IEEE 3-5 Oct. 1988 Page(s): 16, and in Pak, J. J.; Neudeck, G. W.; Kabir, A. E.; DeRoo, D. W.; Staller, S. E., "A new method of forming a thin single-crystal silicon diaphragm using merged epitaxial lateral overgrowth for sensor applications," Electron Device Letters, IEEE Volume 12, Issue 11, November 1991 Page(s): 614-616, respectively, which are incorporated herein by reference in their entirety. The ELO process is a well studied technique in which a monocrystalline silicon region, obtained by etching openings in a thermally grown oxide layer, acts as a seed for single-crystal silicon grown first within the openings and subsequently laterally over the oxide 92, 94, 96. There are also reports on CMOS devices that have been fabricated on an ELO grown silicon layer, which can be found in Shahidi, G.; Davari, B.; Taur, Y.; Warnock, J.; Wordeman, M. R.; McFarland, P., Mader, S.; Rodriguez, M.; Assenza, R.; Bronner, G.; Ginsberg, B.; Lii, T.; Polcari, M.; Ning, T. H.; "Fabrication of CMOS on ultrathin SOI obtained by epitaxial lateral overgrowth and chemical-mechanical polishing," Electron Devices Meeting, 1990, Technical Digest., International 9-12 Dec. 1990 Page(s): 587-590, and in Dolny, G.; Ipri, A.; Jastrzebski, L.; Flatley, D., "Fabrication of SOI CMOS over large-area continuous-oxide films formed using epitaxial lateral overgrowth techniques," Electron Devices, IEEE Transactions on Volume 35, Issue 12, December 1988 Page(s): 2437, which are incorporated herein by reference in their entirety.

Referring now to FIG. 11, after the full epitaxial layer 30 is grown, one or more imaging structure 102 (CCD/CMOS imaging structure) of the types described for the first embodiment may be fabricated substantially overlying and extending into the full epitaxial layer 30. The one or more imaging structures 102 may be aligned on the epitaxial layer 30 using alignment keys as a guide so as to substantially overlying the optical shields 72 using known methods of semiconductor fabrication. The one or more imaging structures 102 may include alternating light detection regions 42 and charge transfer regions 44, as already described for the imaging structures of FIG. 2.

After fabrication of the one or more imaging structures 102 is completed, the handle wafer 24 is removed by etching from the back side of the back-illuminated imager 103 as shown in FIG. 12. The insulator layer 26 can be thinned to a desired thickness such that it acts as an anti-reflective layer to a desired incoming wavelength of light. Alternatively, the insulating layer 26 can also be removed completely, and another suitable material can be deposited on the remaining epitaxial layer 30 which can be of a desired thickness so as to act as an anti-reflective coating/layer. A similar anti-reflective coating/layer technique can be applied to the first embodiment of FIG. 2.

FIGS. 13-22 illustrate a third embodiment of a process for manufacturing smear-free back-illuminated imagers and a resulting device generally indicated at 110, wherein like reference numbers indicate like structures to those described in the first embodiment 30 of FIG. 2 and the second embodiment of FIG. 12. Referring now to FIG. 22, which depicts the fully manufactured back-illuminated imager 110, optical shields 72 are deposited and patterned on a partially grown silicon epitaxial layer 30 using an ELO technique, combined with underlying high energy implants 52. The optical shields 72 and high energy implants 52 are aligned with each other and with the charge transfer regions 44 during device fabrication.

Figure 13:
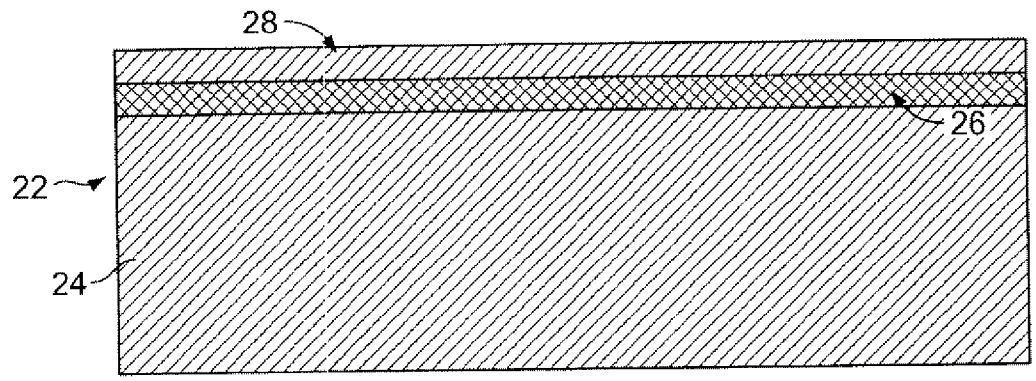
FIG. 13 shows a silicon-on-insulator (SOI) substrate used as the starting material for the manufacture of a back-illuminated imager employing both a high energy implant and an optical shield to reduce smear, the optical shield being located between and aligned with charge transfer regions and the high energy implants, constructed in accordance with a third embodiment of the present invention.
Figure 14:
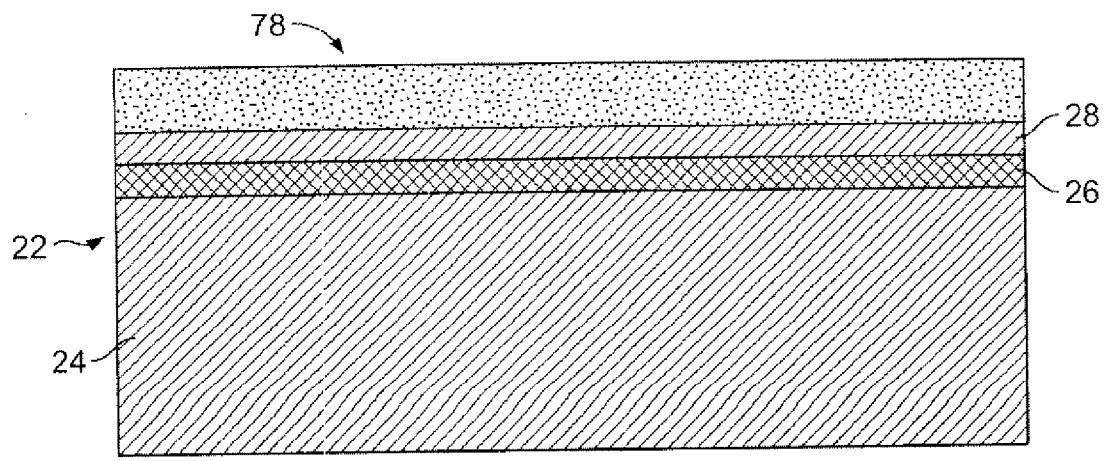
FIG. 14 shows the step of depositing a partial epitaxial layer substantially overlying a seed layer of the substrate depicted in FIG. 13.
Figure 15:
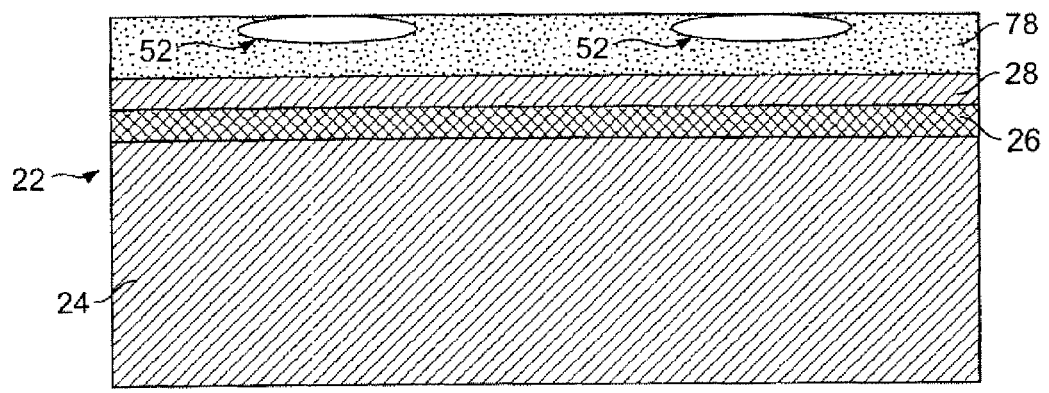
FIG. 15 shows the step of forming a high energy implant in the partial epitaxial layer of FIG. 14.

Referring now to FIG. 13, an SOI/bulk silicon wafer 22 is used as the starting material. As with the embodiment of FIG. 4, the SOI/bulk silicon wafer 22 is composed of handle wafer 24, an insulator layer 26, and seed layer 28. Referring now to FIG. 14, a partial epitaxial layer 78 of about 5 um in thickness with a desired resistivity is grown substantially overlying the seed layer 28. Referring now to FIGS. 15 and 22, high energy implants 42 are formed in regions of the partial epitaxial layer 78 to be aligned with the optical shields 72 and the charge transfer regions 44 to be discussed hereinbelow.

Figure 16:
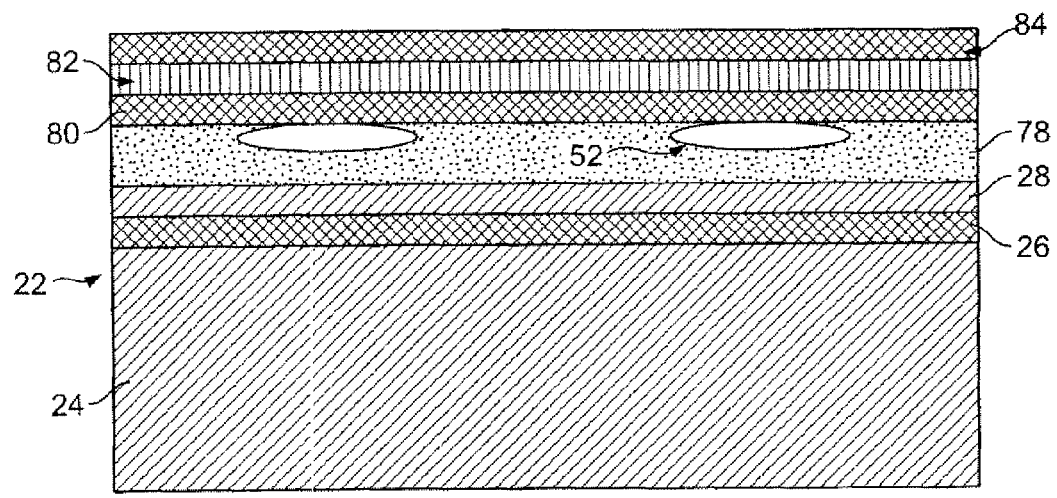
FIG. 16 shows the step of depositing a thin oxide layer substantially overlying the partial epitaxial layer and the high energy implant of FIG. 15.
Figure 17:
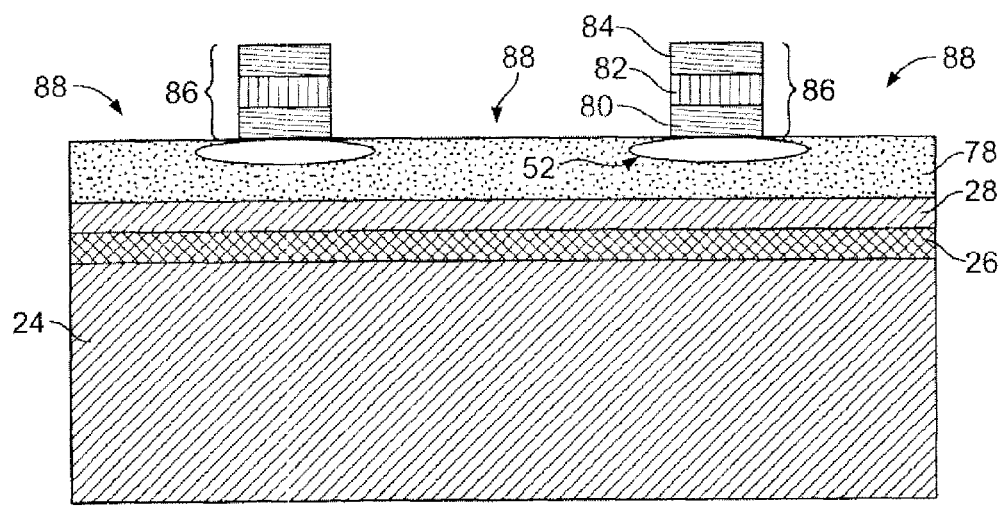
FIG. 17 shows the step of patterning layers of oxide and an optically opaque layer using photolithography followed by anisotropic etching so as to produce sandwich structures with open gaps therebetween in the device of FIG. 16.
Figure 18:
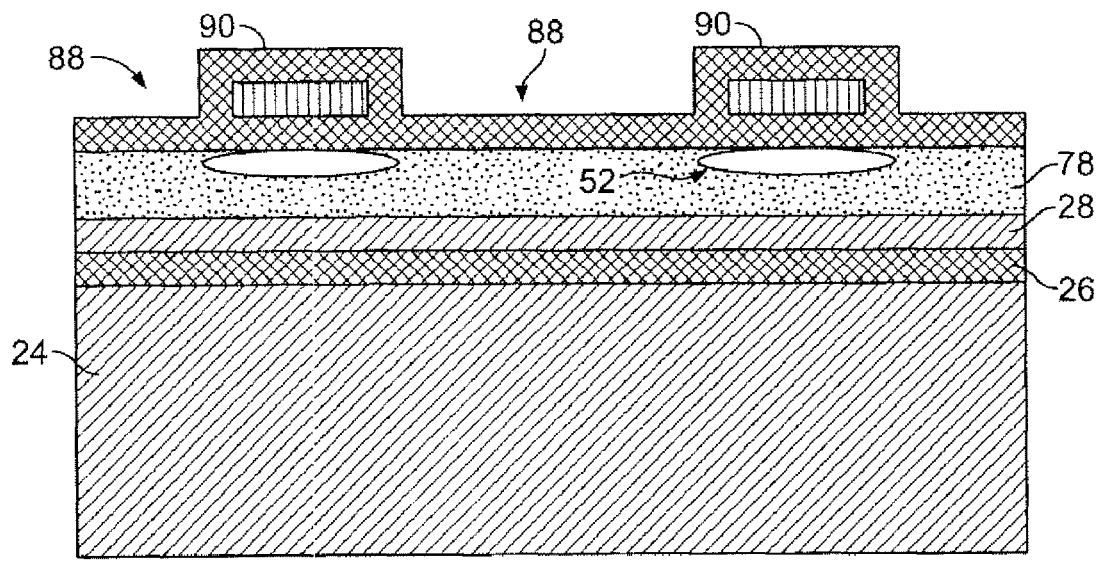
FIG. 18 shows the step of filling the open gaps with another layer of oxide in the device of FIG. 17.
Figure 19:
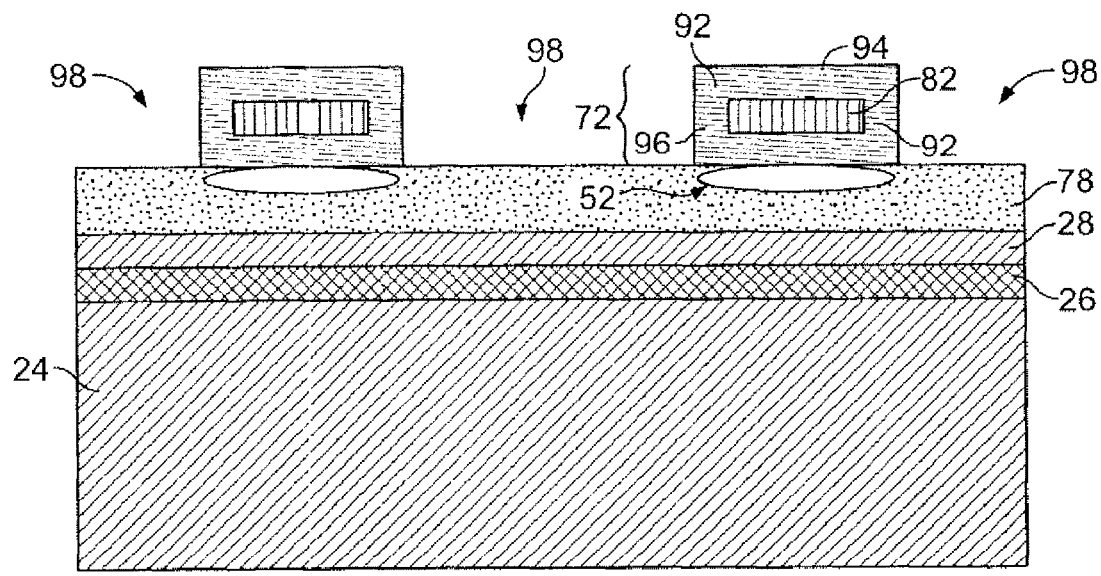
FIG. 19 shows a second step of patterning involving photolithography and anisotropic etching to produce an optically opaque layer encapsulated by oxide on the sides, top and bottom, with the remaining surfaces of the partial epitaxial layer exposed in the device of FIG. 18.

Referring now to FIG. 16, a thin oxide layer 80, preferably an oxide of silicon, is deposited substantially overlying the partial epitaxial layer 78 and the high energy implants 42. A suitable optically opaque layer 82 (absorptive or reflective) of appropriate thickness is deposited substantially overlying the thin oxide layer 80. An additional layer of oxide 84 is deposited substantially overlying the optically opaque layer 82. Referring now to FIG. 17, the layers of oxide 80, 84 and optically opaque layer 82 are patterned with photolithography followed by anisotropic etching so as to produce sandwich structures 86 with open gaps 88 therebetween. Alignment keys (not shown) are also printed on and etched into the exposed partial epitaxial layer 78 in a manner similar to that described in FIG. 3 for subsequent optical component alignment. Referring now to FIG. 18, another layer of oxide 90 is deposited in the open gaps 88, followed by photo and anisotropic etching to produce the device configuration of FIG. 19, in which the optically opaque layer 82 is encapsulated by oxide on the sides 92, top 94, and bottom 96, with the remaining surfaces 98 of the partial epitaxial layer 78 exposed.

Figure 20:
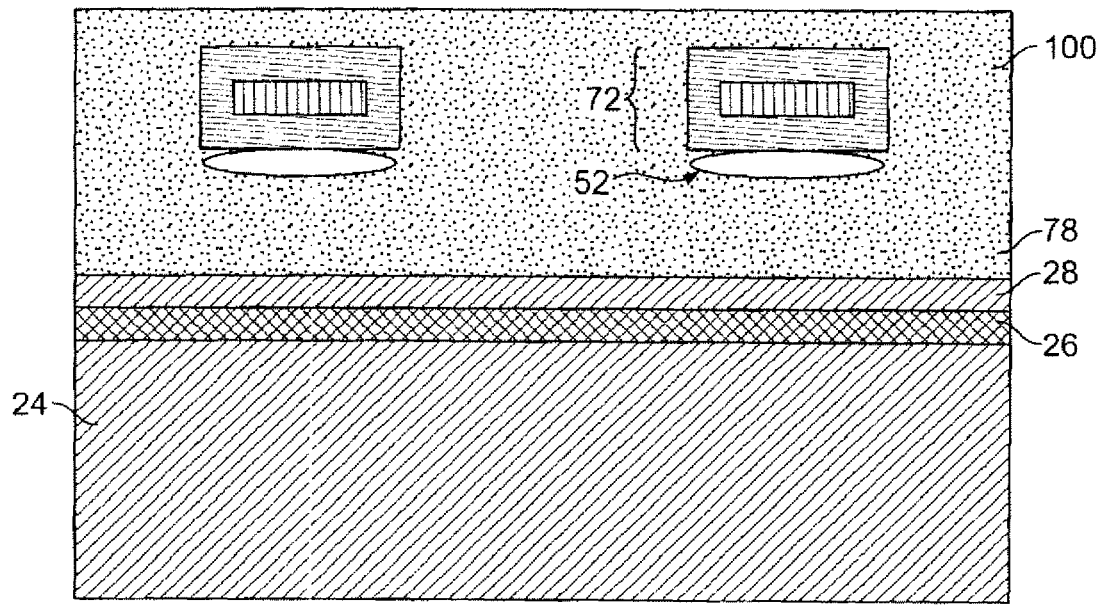
FIG. 20 shows the step of using an Epitaxial Lateral Overgrowth (ELO) or a Merged ELO technique to grow a remaining portion of the partial epitaxial layer in the device of FIG. 19.

Referring now to FIG. 20, using an Epitaxial Lateral Overgrowth (ELO) or Merged ELO technique, a remaining portion 100 of the exposed partial epitaxial layer 78 is grown for about 5 um to fill in the open gaps 88 and to cover the top oxide portions 94 encapsulating the optically opaque layers 82 to form the optical shields 72.

Figure 21:
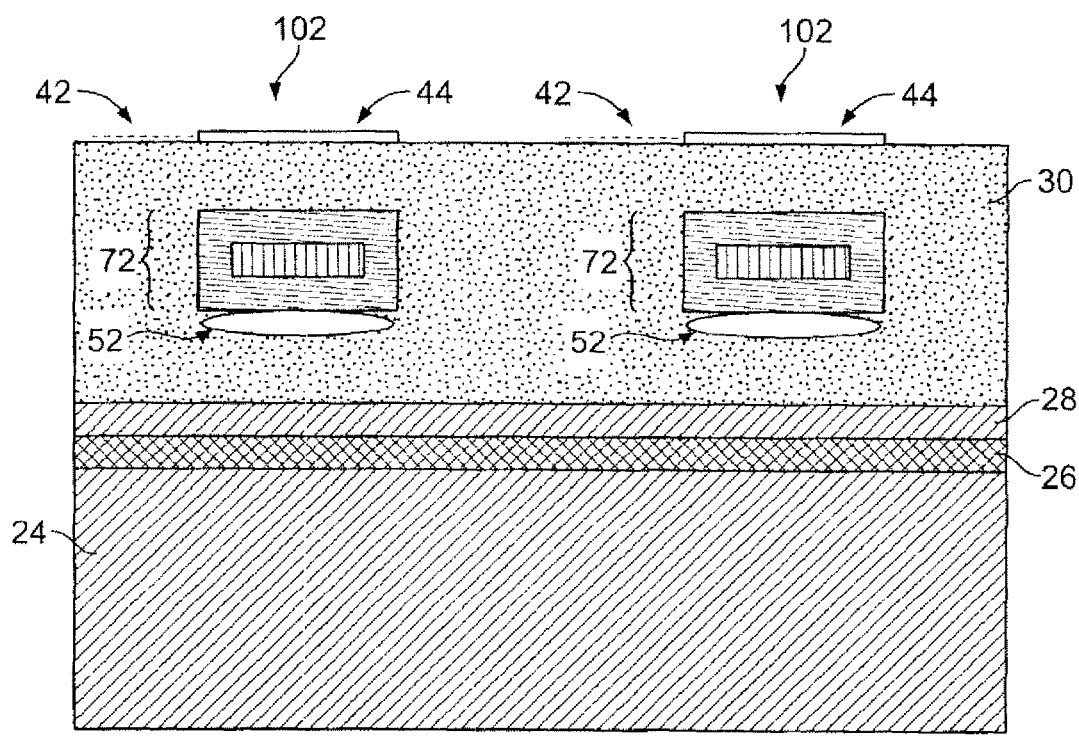
FIG. 21 shows the step of fabricating one or more imaging components on the epitaxial layer in the device of FIG. 20.

Referring now to FIG. 21, after the full epitaxial layer 30 is grown, one or more imaging structures 102 of the types described for the first and second embodiments may be fabricated substantially overlying and extending into the full epitaxial layer 30. The one or more one or more imaging structures 102 may be aligned on the epitaxial layer 30 using alignment keys as a guide so as to substantially overlying the optical shields 72 using known methods of semiconductor fabrication. The one or more imaging structures 102 may include alternating light detection regions 42 and charge transfer regions 44, as already described for the imaging structures of FIG. 2.

After fabrication of the one or more imaging components 54 is completed, the handle wafer 24 is removed by etching from the back side of the back-illuminated imager 110 as shown in FIG. 22. The insulator layer 26 can be thinned to a desired thickness such that it acts as an anti-reflective layer to a desired incoming wavelength of light. Alternatively, the insulating layer 26 can also be removed completely, and another suitable material can be deposited on the remaining epitaxial layer 30 which can be of a desired thickness so as to act as an anti-reflective coating/layer.

FIG. 23 illustrates a fourth embodiment of a process for manufacturing smear-free back-illuminated imagers and a resulting device generally indicated at 120, wherein like reference numbers indicate like structures to those described in the third embodiment 110 of FIG. 21. FIG. 23 depicts the fully manufactured back-illuminated imager 120, optical shields 72 are deposited and patterned on a partially grown silicon epitaxial layer 30 using an ELO technique, combined with overlying high energy implants 52. The optical shields 72 and high energy implants 52 are aligned with each other and with the charge transfer regions 44 during device fabrication. The device 120 is similar to the device 110, except that the high energy implant 72 is inserted between the optical shields 72 and the charge transfer regions 44. The only processing step that differs from the steps outlined in FIGS.

13-22 is that the high energy implants 52 are formed in the epitaxial layer 30 after the full epitaxial layer 30 is grown, but before one or more imaging structures 102 are fabricated. The high energy implants 52 and the one or more imaging structures 102 may be aligned on/in the epitaxial layer 30 using alignment keys as a guide.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A method for fabricating a semiconductor device, comprising the steps of:
    providing a substrate having a front surface and a back surface;
    growing an epitaxial layer substantially overlying the substrate on the front surface;
    depositing at least one optical shield substantially within the epitaxial layer;
    fabricating at least one structure overlying and extending into the epitaxial layer, the structure comprising at least one charge transfer region, the at least one optical shield substantially underlying the at least one charge transfer region,
    wherein light incident on the back surface of the substrate generates charge carriers which are diverted away from the at least one charge transfer region by the at least one optical shield.

2. The method of claim 1, wherein at least a portion of the epitaxial layer is grown using an epitaxial lateral overgrowth technique.

3. The method of claim 1, wherein the at least one structure is one of a CCD imaging structure and a CMOS imaging structure.

4. The method of claim 1, wherein the step of depositing at least one optical shield comprises the steps of:
    depositing an optically opaque material substantially overlying a portion of the epitaxial layer proximal to front surface of the substrate; and
    substantially surrounding the optically opaque material with a layer of oxide material.

5. The method of claim 4, wherein the optically opaque material is made from one of an optically reflective and an optically absorptive material.

6. The method of claim 5, wherein the optically opaque material comprises a doped graded layer.

7. The methods of claim 6, wherein the step of depositing at least one optical shield comprises the steps of:
    depositing a first oxide layer substantially overlying a first portion of the epitaxial layer proximal to the front surface of the substrate;
    depositing an optically opaque layer substantially overlying the first oxide layer;
    depositing a second oxide layer substantially overlying the optically opaque layer;
    applying a first photolithographic step followed by a first anisotropic etching step so as to expose sides in the optically opaque layer with the remaining surfaces of the first portion of the epitaxial layer substantially exposed;
    depositing a third layer of layer of oxide substantially overlying the exposed surfaces of the first portion of the epitaxial layer and substantially submersing the sides of the optically opaque layer; and
    applying a second photolithographic step and a second anisotropic etching step to produce an optically opaque layer encapsulated by oxide on the sides, top and bottom, with the remaining surfaces of the first portion of the epitaxial layer exposed.

8. The method of claim 7, further comprising the step of growing the remaining portion of the epitaxial layer using an epitaxial lateral overgrowth technique.

9. The method of claim 8, further comprising the step of forming a high energy implant substantially within the remaining portion of the epitaxial layer, wherein the high energy implant and substantially underlies the at least one charge transfer region and substantially overlies the optical shield.

10. The method of claim 1, wherein the step of depositing at least one optical shield further comprises the steps of:
    forming a high energy implant substantially within the epitaxial layer proximal to the front surface of the substrate and substantially aligned with the charge transfer region; and
    depositing at least one optical shield substantially within the epitaxial layer and substantially overlying the high energy implant.

11. The method of claim 10, wherein the step of depositing at least one optical shield further comprises the steps of:
    depositing an optically opaque material substantially overlying a first portion of the epitaxial layer proximal to the front surface of the substrate; and
    substantially surrounding the optically opaque material with a layer of oxide material.

12. The method of claim 11, wherein the of depositing at least one optical shield further comprises the steps of comprises the steps of:
    depositing a first oxide layer substantially overlying a first portion of the epitaxial layer proximal to the front surface of the substrate;
    depositing an optically opaque layer substantially overlying the first oxide layer;
    depositing a second oxide layer substantially overlying the optically opaque layer;
    applying a photolithographic step followed by a first anisotropic etching step so as to expose sides in the optically opaque layer with the remaining surfaces of the first portion of the epitaxial layer substantially exposed;
    depositing a third layer of layer of oxide substantially overlying the exposed surfaces of the first portion of the epitaxial layer and substantially submersing the sides of the optically opaque layer; and
    applying a second photolithographic step and a second anisotropic etching step to produce an optically opaque layer encapsulated by oxide on the sides, top and bottom, with the remaining surfaces of the first portion of the epitaxial layer exposed.

13. The method of claim 12, further comprising the step of growing the remaining portion of the epitaxial layer using an epitaxial lateral overgrowth technique.

14. The method of claim 1, wherein the substrate comprises:
    a handle wafer;
    an insulator layer substantially overlying the handle wafer; and
    a seed layer substantially overlying the insulator layer; and
    further comprising the steps of removing the handle wafer and thinning the insulating layer such that the insulating layer acts as an anti reflective coating.

15. A device, comprising:
a substrate having a front surface and a back surface;
an epitaxial layer substantially overlying the front surface of the substrate;
at least one optical shield substantially formed within the epitaxial layer;
at least one structure formed at least partially overlying and extending into said epitaxial layer, the at least one structure comprising at least one charge transfer region, the at least one optical shield substantially underlying the at least one charge transfer region;
wherein light incident on the back surface of the substrate generates charge carriers which are diverted away from the at least one charge transfer region by the at least one optical shield.

16. The device of claim 15, wherein at least a portion of the epitaxial layer is grown using an epitaxial lateral overgrowth technique.

17. The device of claim 15, wherein the at least one structure is one of a CCD imaging structure and a CMOS imaging structure.

18. The device of claim 15, wherein the at least one optical shield comprises:
an optically opaque material; and
a layer of oxide material substantially surrounding the optically opaque material.

19. The device of claim 18, wherein the optically opaque material is made from one of an optically reflective and an optically absorptive material.

20. The device of claim 19, wherein the optically opaque material comprises a doped graded layer.

21. The device of claim 20, wherein at least a portion of the epitaxial layer is grown using an epitaxial lateral overgrowth technique.

22. The device of claim 21, further comprising at least one high energy implant substantially overlying the optical shield and substantially underlying the at least one charge transfer region.

23. The device of claim 22, further comprising at least one high energy implant substantially underlying the optical shield.

24. The device of claim 15, wherein the substrate comprises:
a handle wafer;
an insulator layer substantially overlying the handle wafer; and
a seed layer substantially overlying the insulator layer;
wherein the handle wafer is removed and the insulating layer is thinned such that the insulating layer acts as an antireflective coating.

* * * * *